(12) United States Patent
Youngblood, Jr.

(10) Patent No.: US 12,216,148 B2
(45) Date of Patent: Feb. 4, 2025

(54) APPARATUS AND METHOD FOR DETECTING HOLIDAYS IN LINERS

(71) Applicant: Solmax International Inc., Varennes (CA)

(72) Inventor: Jimmie Gordon Youngblood, Jr., Kingwood, TX (US)

(73) Assignee: Solmax International Inc. (CA)

( * ) Notice: Subject to any disclaimer, the term of this patent is extended or adjusted under 35 U.S.C. 154(b) by 179 days.

(21) Appl. No.: 17/336,683

(22) Filed: Jun. 2, 2021

(65) Prior Publication Data

US 2022/0390499 A1    Dec. 8, 2022

(51) Int. Cl.
*G01R 31/12*    (2020.01)
*G01R 19/165*   (2006.01)
*G08B 3/00*     (2006.01)
*G08B 5/36*     (2006.01)

(52) U.S. Cl.
CPC ....... *G01R 31/1227* (2013.01); *G01R 19/165* (2013.01); *G08B 3/00* (2013.01); *G08B 5/36* (2013.01)

(58) Field of Classification Search
CPC .. G01R 31/1227; G01R 31/12; G01R 19/165; G01R 31/52; G01R 31/1263; G08B 3/00; G08B 5/36
See application file for complete search history.

(56) References Cited

U.S. PATENT DOCUMENTS

| | | | |
|---|---|---|---|
| 4,241,304 A | 12/1980 | Clinton | |
| 5,302,904 A * | 4/1994 | Nopper | G01R 31/59 |
| | | | 324/536 |
| 2012/0126839 A1 * | 5/2012 | Schaefer | G01R 31/52 |
| | | | 324/750.01 |
| 2015/0003480 A1 * | 1/2015 | Stephanson | G01D 21/00 |
| | | | 370/537 |
| 2016/0370415 A1 * | 12/2016 | Carroll | G01R 31/59 |
| 2022/0390499 A1 * | 12/2022 | Youngblood, Jr. | G01R 19/165 |

OTHER PUBLICATIONS

Youngblood et al., "The Technical Background and Successful Field Experience of Spark Testing a Conductive Liner", GSE Technical Document (2009). (Year: 2009).*
International Search Report and Written Opinion dated Feb. 28, 2022.
Youngblood, J., and B. Ward. "The Technical Background and Successful Field Experience of Spark Testing a Conductive Liner." GSE Technical Document (2009). http://cheshmehtm.ir/wp-content/uploads/2015/05/FieldSTLeak-Location.pdf.

* cited by examiner

*Primary Examiner* — Son T Le
(74) *Attorney, Agent, or Firm* — Barnes & Thornburg LLP; Tina M. Dorr

(57) ABSTRACT

An apparatus and method for identifying liner holidays, with a generator having two contacts with a liner and pulsing current to a moving one of the contacts. A plurality of detected electric signals are processed to continuously generate a baseline indicative of a holiday. A holiday signal is actuated when a signal is detected which when compared to the generated baseline indicates a holiday. A plurality of electric signal types and baselines, such as current strength and voltage, may be separately detected with a holiday signal actuated when either signal type is detected which when compared to its generated baseline indicates a holiday. The moving contact may be flexible to conform to contour of the liner.

21 Claims, 4 Drawing Sheets

APPARATUS AND METHOD FOR DETECTING HOLIDAYS IN LINERS

CROSS-REFERENCE TO RELATED APPLICATIONS

Not Applicable.

FEDERALLY SPONSORED RESEARCH OR DEVELOPMENT

Not Applicable.

MICROFICHE/COPYRIGHT REFERENCE

Not Applicable.

FIELD OF THE INVENTION

A method and device for detecting holidays (punctures) in electrically insulating material.

BACKGROUND OF THE INVENTION

Conventional holiday or puncture detection employs a device including a high voltage source connected to two or more electrodes located on the surface on the insulating layer. One electrode is swept along the tested surface and, when a holiday in the insulating layer is encountered, a spark jumps from the electrode to the puncture. A detection mechanism identifies any spark event and typically signals the operator (e.g., by an audible sound and/or visual indication) who can then note the location of the electrode as being the location of a holiday.

The high voltage source has been a direct current (DC) or alternating current (AC), though typically the voltage has been pulsed (AC) with each pulse achieving the highest voltage during a short time interval. The source of high voltage has typically been pulsed at a rate sufficiently fast to ensure the test area is covered while the electrode is pulled or pushed by the user. Particularly with AC pulses, the detection mechanism must be able to reliably differentiate a normal pulse discharge (no holiday) from a spark (holiday), with such differentiation typically having been based on changes in the current or voltage amplitude sensed during the absence and the presence of a spark.

Unfortunately, conventional detection mechanisms oftentimes have had difficulty detecting a holiday reliably. Those mechanisms are sensitive to changes in current flowing in the cable from the pulse generator to the brush (versus time), and operate based on inductive coupling which is not sensitive to changes in electric charge. Holidays cause a transient in the current and electric charge built around the electrodes. Since the current in the cable is proportional to the impedance between the brush and the liner, when a holiday is encountered the impedance changes instantaneously and the amplitude of the sensed current reflects that change. Such detection mechanisms determine whether the peak current amplitude exceeds a threshold indicative of a holiday and, when the threshold is exceeded, generate an audible sound and/or visual indication to indicate that the electrode is located at a holiday.

However, similar current changes can result from impedance changes which occur for reasons other than a spark, and such impedance changes can be indistinguishable from those resulting from a holiday. For example, when the electrode is swept across the insulating surface, there are instantaneous variations in the current or voltage imparted to the electrodes, and those normal variations have frequently been flagged as holidays even if there is no spark or puncture in the insulating surface or liner. Additionally, changes in ground conductivity in the soil underneath the liner cause variations that have misled detection mechanisms into producing false positives (false indications of a spark/puncture).

Conventional holiday detectors have permitted the user/operator to manually adjust the level of sensitivity (i.e., the peak current amplitude threshold chosen to indicate a spark) in order to minimize false positives. However, such adjustments do not fully address false positives and false negatives. That is, while the threshold can be manually adjusted, such adjustments are only approximations of the appropriate threshold over an area. Thus, while the threshold may be adjusted to ensure that the detector is sensitive enough to signal a positive where a holiday is known to exist but not so sensitive as to signal a positive where a holiday is known not to exist, such a threshold may not be appropriate in other areas of the liner where different conditions exist (e.g., different ground detectivity, brush contact changes). In short, when detecting for holidays in a liner, even a selection of a threshold which functions well over an area of a liner may be poorly suited for other areas, resulting in holidays being missed and/or holidays being indicated where no holiday exists.

The apparatus and method disclosed herein significantly overcome the above described disadvantages of the prior art.

SUMMARY OF THE INVENTION

A method and apparatus for holiday detection in electrically insulating surfaces is disclosed herein. The apparatus is a portable device including a high voltage generator, at least two moving electrodes delivering a charge to the liner, and a detection mechanism capable of identifying holidays under a wide range of variable environmental or operating conditions, either due to motion of the electrode, variable soil resistivity or others. The holiday detector uses smart signal processing to minimize environmental variability and accurately flag holidays without requiring manual adjustments.

One aspect of the disclosure is a method of detecting holidays in a liner, comprising the steps of (a) creating a circuit for current from a generator to a first contact with the liner to a second contact spaced from the first contact to the generator, the second contact being an electric reference for the generator, (b) pulsing current from the generator to the liner first contact as the first contact is moved over the liner, (c) detecting a plurality of at least one electric signal associated with the pulsing current from the electric reference, (d) continuously processing a selected recent plurality of the detected electric signals to generate a baseline value for the at least one electrical signal, wherein a detected electric signal having a value on one side of the baseline is deemed to indicate no holiday and an electric signal having a value on the other side of the baseline is deemed to indicate a holiday, and (e) actuating a holiday signal when at least one of the detected electric signals has a value on the other side of the baseline.

In one form of this aspect of the disclosure, the second contact is with the top of the liner. In an alternate form, the second contact is with ground beneath the liner.

In one form of this aspect of the disclosure, the liner has a top surface and an electrically conductive bottom surface, and the first and second contacts are in contact with the liner top surface. In a further form, the liner is a geomembrane on a geotechnical site. In a still further form, the geomembrane comprises a plurality of liners joined together at seams.

In another form of this aspect of the disclosure, the at least one electric signal is a selected one of current strength and voltage.

In still another form of this aspect of the disclosure, the at least one electric signal comprises both current strength and voltage, wherein the detected current strength is continuously processed to generate a baseline of current strength and the detected voltage is continuously processed to generate a baseline of voltage. In a further form, the holiday signal is generated when either of the current strength or voltage passes its generated baseline.

In yet another form of this aspect of the disclosure, at least one of energy averaging, filtering, and Fourier spectrum is used to generate the baseline from the recent plurality of detected electric signals.

Another form of this aspect of the disclosure includes the baseline being a selected value greater than an average of the recent plurality of detected electric signals.

Still another form of this aspect of the disclosure includes the actuated holiday signal being at least one of an audible sound and a warning light.

Yet another form of this aspect of the disclosure includes the actuated holiday signal being a location indication corresponding to the area of the liner being contacted by the first contact at the time the detected electric signal has a value on the other side of the baseline. In a further form, the actuated holiday signal is at least one of a signal of grid coordinates on the liner, an audio signal, a visual signal, and a signal of GPS coordinates.

In another aspect of the disclosure, a sensor for detecting holidays in a liner includes a pulsing generator with an electrical reference, an electrode adapted to move over and maintain contact with the liner spaced from the generator electric reference while the generator pulses current to the electrode, a processor, and a holiday signal actuated when any detected electric signal has a value on the other side of the baseline. The processor is adapted to detect over time from the generator electric reference at least one electric signal associated with the pulsing current, continuously process for a recent selected time period the at least one electric signals detected during the selected time period, and generate a baseline of the at least one electrical signal, wherein a detected electric signal having a value on one side of the baseline is deemed to indicate no holiday and an electric signal having a value on the other side of the baseline is deemed to indicate a holiday.

In one form of this aspect of the disclosure, the electric reference is positionable on the liner.

In another form of this aspect of the disclosure, the processor is adapted to detect a selected one of current strength and voltage.

In another form of this aspect of the disclosure, the processor is adapted to detect both current strength and voltage, continuously process current strength to generate a baseline of current strength, and continuously process voltage to generate a baseline of voltage. In a further form, the holiday signal is actuated when either of the detected current strength or detected voltage is on the other side of its generated baseline.

In still another form of this aspect of the disclosure, the processor is adapted to use at least one of energy averaging, filtering, and Fourier spectrum to generate the baseline from the recent plurality of detected electric signals.

In yet another form of this aspect of the disclosure, the actuated holiday signal is at least one of an audible sound and a warning light.

In still another form of this aspect of the disclosure, the holiday signal is a location indication corresponding to the area of the liner being contacted by the electrode at the time the detected electric signal value is on the other side of the baseline.

In still another aspect of the disclosure, a method of detecting holidays in a liner includes the steps of (a) creating a circuit for current from a generator to a first contact with the liner to a second contact spaced from the first contact to the generator, the second contact being an electric reference for the generator, (b) sending current from the generator to the liner first contact as the first contact is moved over the liner, (c) detecting current strength and voltage at the generator electric reference, (d) comparing a baseline current strength to current strength at the generator electric reference, (e) comparing a baseline voltage to voltage at the generator electrical reference, and (f) actuating a holiday signal actuated when either of the current strength or voltage have a value which is on one side of its baseline deemed to indicate a holiday.

In one form of this aspect of the disclosure, the liner has a top surface and an electrically conductive bottom surface, and the first and second contacts are in contact with the liner top surface. In a further form, the liner is a geomembrane on a geotechnical site. In a still further form, the geomembrane comprises a plurality of liners joined together at seams.

In another form of this aspect of the disclosure, the detected current strength is continuously processed to generate the baseline of current strength and the detected voltage is continuously processed to generate the baseline of voltage. In a further form, the holiday signal is generated when either of the current strength or voltage passes its generated baseline.

In still another form of this aspect of the disclosure, at least one of energy averaging, filtering, and Fourier spectrum is used to generate the baseline from the recent plurality of detected electric signals.

In yet another form of this aspect of the disclosure, the baseline is a selected average of the recent plurality of detected electric signals.

Another form of this aspect of the disclosure includes the actuated holiday signal being at least one of an audible sound and a warning light.

Still another form of this aspect of the disclosure includes the actuated holiday signal being a location indication corresponding to the area of the liner being contacted by the first contact at the time either the current strength has a value on the one side of the current strength baseline deemed to indicate a holiday or the voltage has a value on the one side of the voltage baseline deemed to indicate a holiday.

In yet another aspect of the invention, a sensor for detecting holidays in a liner includes a generator with an electric reference positionable on or adjacent to the liner, an electrode adapted to move over and maintain contact with the liner spaced from the generator electric reference while the generator sends current to the electrode, a detector detecting current strength and voltage at the generator electric reference, and a processor adapted to (i) compare a baseline current strength to current strength at the generator electric reference, and (ii) compare a baseline voltage to voltage at the generator electric reference. A holiday signal is actuated when either the detected current strength has a value which is on a side of its baseline current strength deemed to be indicative of a holiday or the detected voltage has a value which is on a side of its baseline voltage deemed to be indicative of a holiday.

In one form of this aspect of the disclosure, the processor is adapted to continuously process current strength to generate the baseline current strength, and continuously process voltage to generate the baseline voltage. In a further form, the processor is adapted to use at least one of energy averaging, filtering, and Fourier spectrum to generate the baseline from the recent plurality of detected electric signals.

In another form of this aspect of the disclosure, the holiday signal is actuated when either of the detected current strength or detected voltage is on the side of its generated baseline deemed to be indicative of a holiday.

In still another form of this aspect of the disclosure, the actuated holiday signal is at least one of an audible sound and a warning light.

In yet another form of this aspect of the disclosure, the holiday signal is a location indication corresponding to the area of the liner being contacted by the electrode when the detector detects at least one of current strength and voltage having a value which is on a side of its baseline deemed to be indicative of a holiday.

Another aspect of the disclosure is a sensor defining a circuit for detecting holidays in a liner having a varying contour, including a generator with an electric reference and a contact receiving current from the generator. The contact is adapted to move over areas of the liner spaced from the generator electric reference while the generator sends current to the contact, wherein the contact conforms to the varying contours of the liner areas.

In one form of this aspect of the disclosure, the contact is a flexible conductive sheet.

In another form of this aspect of the invention, the contact is flexible chain mail.

In still another form of this aspect of the invention, the contact includes a truck rolling on guide wheels, a flexible conductive cable supported between the guide wheels, and a plurality of conductive rollers spaced along the cable wherein each roller is rotatable about the cable.

Other objects, features, and advantages of the invention will become apparent from a review of the entire specification, including the appended claims and drawings.

DETAILED DESCRIPTION

As described in detail below, a new apparatus and method for identifying liner holidays is disclosed including a generator having two contacts with a liner, with the generator pulsing current to a moving one of the contacts. The pulsing current is continuously processed to continuously generate a baseline indicative of a holiday. Additionally, a plurality of detected electric signals, such as current strength and voltage, may be so processed to continuously generate baselines for each signal indicative of a holiday, where a holiday signal is actuated when any signal is detected which when compared to its generated baseline indicates a holiday. The moving contact may be flexible to conform to contour of the liner.

Figure 1:
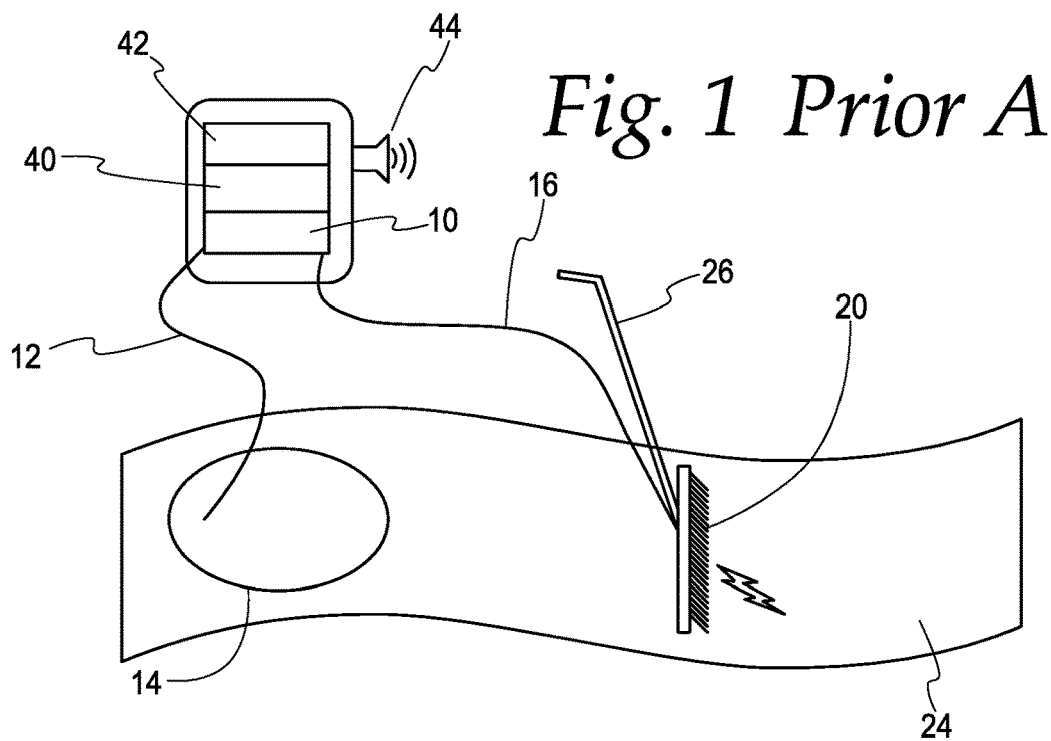
FIG. 1 is an illustration of a prior art sensor used to detect holidays on a liner.
Figure 2:
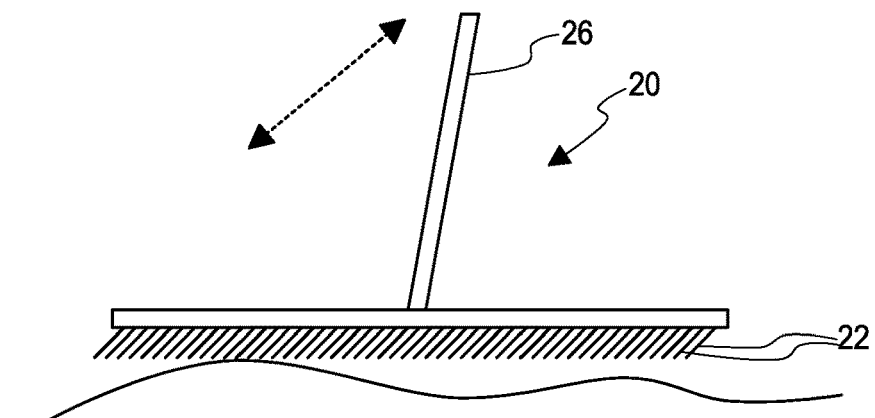
FIG. 2 is an illustration of an electrode brush used with prior art sensors such as in FIG. 1.
Figure 3:
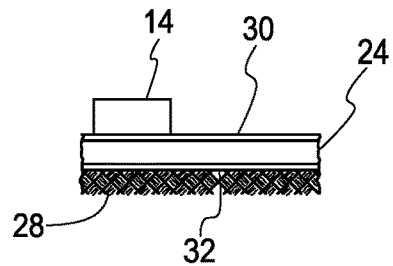
FIG. 3 is a cross-sectional illustration of a grounding pad and liner laid on soil as used with prior art liners and sensors such as illustrated in FIG. 1.

As further background to the disclosure, FIGS. 1-3 herein provide greater detail regarding a prior art apparatus upon which the apparatus and method disclosed herein improves.

Specifically, FIG. 1 illustrates a detecting apparatus defining a circuit in which a high voltage generator 10 has a first cable 12 connecting to an electrode or grounding pad 14 and a second cable 16 connected to a movable electrode or conductive brush 20. In use, the apparatus grounding pad 14 (i.e., electric reference, such as a ground) is connected to the top of the liner 24 being tested, and the electrode brush 20 is moved over areas of the liner 24. The generator 10 has provided a constant current or in some versions has generated high voltage pulses.

The grounding pad 14 serves as a capacitive plate to couple electrical energy into the liner 24. However, it should be understood that the grounding pad 14 could in some applications be placed on the ground and not on the liner 24 (i.e., the grounding pad 14 could be placed on the ground or land outside of the boundaries of the liner 24).

The brush 20 has typically been made of metallic bristles 22 which form an electrode to impart high voltage on the liner 24, where in the presence of a holiday a spark is generated. A nonconductive handle 26 is attached to the brush 20 and allows the user to sweep the brush 20 across the liner 24 for testing. However, as illustrated in FIG. 2, the stiff bristles of the brush 20 have been susceptible to variations in contacting the liner 24, particularly where the liner contour is not flat.

As illustrated in FIG. 3, liners 24 such as geomembranes typically lie on soil 28 and are intended to be impermeable, with an insulating top layer 30 and a conductive bottom layer 32. The circuit of the apparatus will flow from the brush 20 through the liner 24 to the grounding pad 14. It should be appreciated that such current flow will be affected if the brush 20 contacts an area of the liner 24 having a holiday, as rather than being limited to flowing along the insulating top layer 30 the current may flow through the holiday and then along the conductive bottom layer 32.

Such prior art apparatuses have included a detector 40 in the circuit for detecting current flow, and a comparator 42 which compares the signal to a threshold taken to be indicative of a holiday. For example, if the current strength spikes to a value above the threshold, that would be taken to indicate a holiday (i.e., wherein the spiked strength indicates flow through the liner conductive bottom layer). However, as previously noted, while a spike of current flow could be indicative of a holiday, it could also result from other factors, such as instantaneous variations in the current or voltage imparted to the electrodes and changes in ground conductivity in the soil underneath the liner (depending on, e.g., soil type and humidity). Other factors could include, for example, abrupt changes in the motion of the brush 20 and/or abrupt changes in the extent of contact between the brush 20 and liner 24.

The threshold used by the comparator 42 has been set manually, whether based on operator experience or by initially testing current strength at areas where it is known that there is no holiday and/or where one is known. Once testing begins, the threshold has been set for the entire tested area, though the operator may manually change the threshold if it is determined that the threshold is inappropriately returning false positives (indicating a holiday where there is none) or false negatives (not recognizing a holiday where one exists).

An audible alarm 44 has alerted the operator when the detected electrical signal passes the threshold as is indicative of the brush 20 being located at a holiday.

Figure 4:
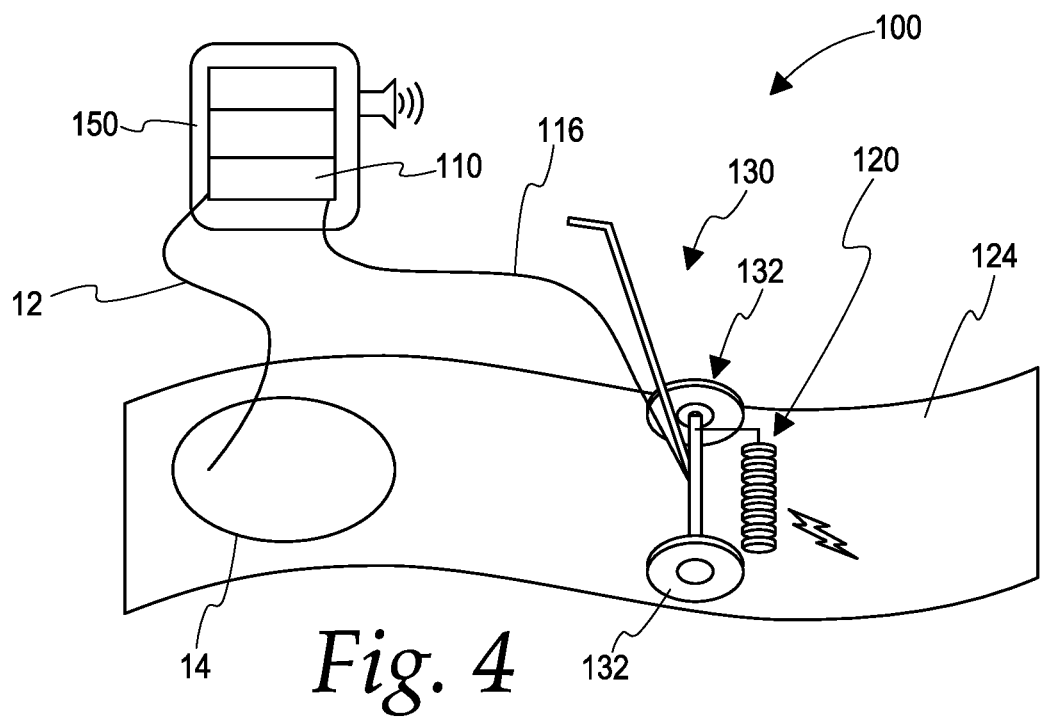
FIG. 4 is an illustration of a new sensor disclosed herein and used to detect holidays on a liner.

The improved apparatus and method disclosed herein is illustrated beginning with FIG. 4. That is, as illustrated in FIG. 4 and described in more detail herebelow, the sensor 100 for identifying holidays in liners 124 includes an improved movable electrode or contact 120 which maintains a uniform contact with unevenly contoured liners 124. Further, as also illustrated and described in more detail herebelow, a high voltage generator 110 generates a signal which is advantageously processed in the sensor 100 in a manner which greatly reduces false positive and false negatives.

Figure 5:
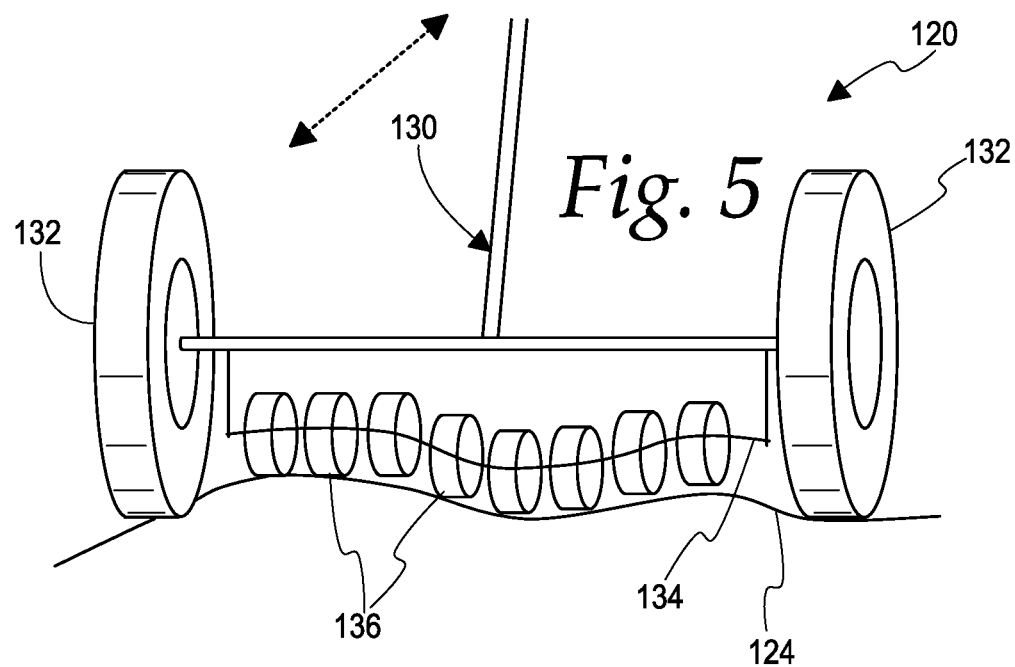
FIG. 5 is an illustration of a new movable contact for sensors used to detect holidays on a liner.

Specifically, as shown in FIGS. 4-5, the movable contact 120 includes a truck 130 rolling on guide wheels 132 with a flexible conductive cable 134 supported between the guide wheels 132. A plurality of conductive rollers 136 are spaced along the cable 134 wherein each roller 136 is rotatable about the cable 134. As illustrated, given the flexibility of the cable 134, all the rollers 136 will contact the liner 124 even in areas which are not flat but have rolling contours.

Figure 6A:
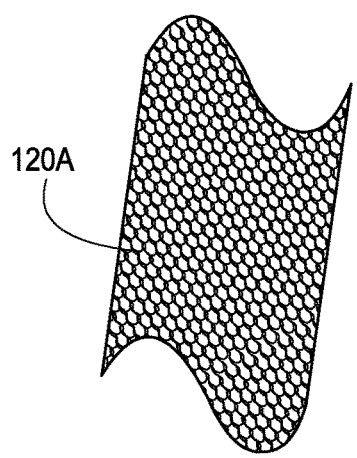
FIGS. 6A and 6B are alternative movable contacts for sensors used to detect holidays on a liner.
Figure 6B:
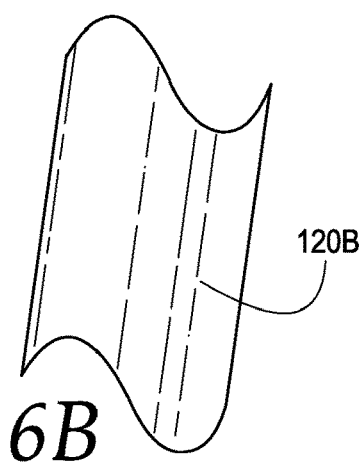

Still other variations for the movable contact include materials which are flexible, surface conforming, and conductive, such as chainmail 120A illustrated in FIG. 6A and a flexible conductive film 120B (e.g., conductive neoprene) illustrated in FIG. 6B which can be dragged across the liner 124.

Figure 7:
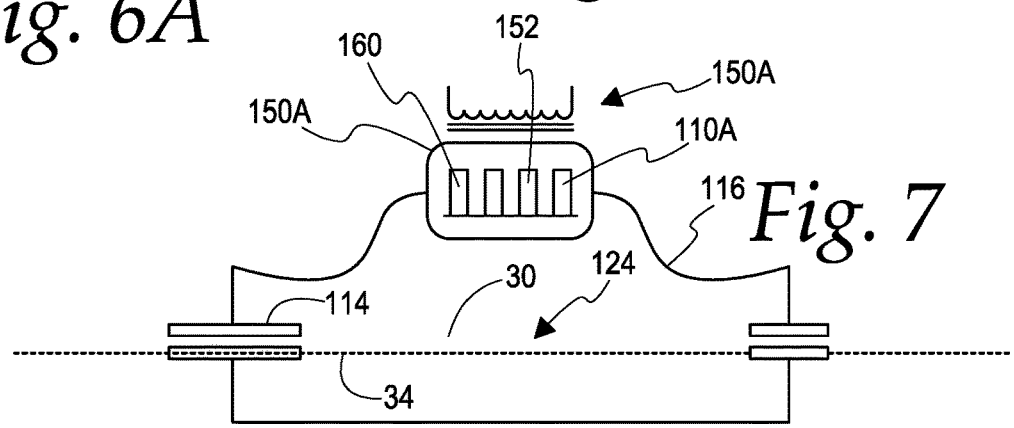
FIG. 7 is an illustration of an electromagnetic detector such as may be used with the sensor of FIG. 4.

Further, referring to FIG. 4 and the improvement disclosed herein, the sensor 100 also includes a holiday detector unit 150 which includes a high voltage generator 110. Further, the high voltage generator may be a high voltage pulse generator 110A (see FIG. 7) whereby the holiday detector unit 150A may advantageously determine the holiday baseline measurement dynamically as discussed in further detail below.

Figure 8:
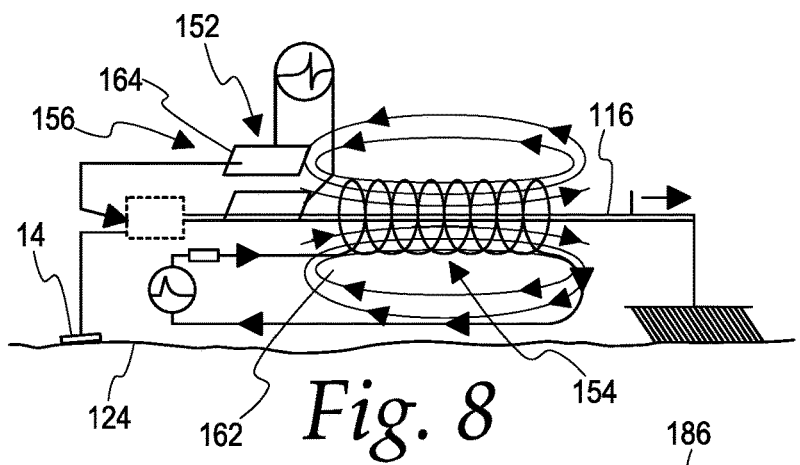
FIG. 8 is an illustration of an alternative embodiment of a holiday sensor wherein both current and voltage may be detected to determine the presence of a holiday.

Referring now to FIG. 8, the detector unit 150 in another aspect of the disclosure may advantageously include an electromagnetic detector 152 (see FIG. 7) which senses not only current traveling through the high voltage cable 116 but the energy (voltage and current) from the high voltage generator 110. An electromagnetic detector 152 is more sensitive than current detectors used in prior art systems, and thus is less susceptible to false positive and false negative signals.

Further, an electromagnetic detector 152 such as illustrated in FIG. 8 may be advantageously used with a high voltage pulse generator 110A. The electromagnetic detector 152 is a combination of magnetic (inductive) coupler 154 and electric (capacitive) coupler 156 which senses the energy variation taking place in the high voltage pulse generator 110A. The electromagnetic detector 152 is sensitive to changes in current flowing in the high voltage cable 116 and to changes in electric charge between the electrode (e.g., FIGS. 5, 6A, 6B) and the liner 124. A processor 160 compares the sensed signals to thresholds for each signal (e.g., current and voltage) which are deemed to be indicative or not of a holiday.

(Generally, a spike in a signal such as a spark causing the current strength to exceed a threshold or baseline would be indicative of a holiday. However, it should be understood that for different signals it is possible that a signal reducing below a threshold would be indicative of a holiday. As such, while the disclosure may generically at times herein refer to exceeding or surpassing a baseline or threshold in reference to detecting a holiday, more precisely when referring to a signal indicating a holiday based on the signal relative to its baseline or threshold, it should be said that a holiday is detected when that signal strength has a value which is on a side of its baseline or threshold [i.e., above or below] which is deemed to be indicative of a holiday.)

Further, the electromagnetic detector 152 may advantageously measure changes in both current and voltage by coupling to the high voltage cable 116 through a winding and toroid 162 of an inductive coupler 154 and through conductive plates 164 of an electric (capacitive) coupler 156. FIG. 8 illustrates such a sensor 100 wherein an inductive coupler 154 with toroid with winding 162 is used to sense current in the high voltage cable 116 and an electric coupling 156 with conductive plates 164 is used to sense voltage. By sensing both current (by measuring the magnetic field) and electric field changes versus time, the sensor 100 can detect smaller fluctuations and is more sensitive to small holidays than with prior art sensors. For example, with each of a plurality of signals being compared its own separate baseline, a holiday can be detected in instances where only one of the signals exceeds its baseline (e.g., in instances in which a holiday may cause a minor change in current but cause a significant and noticeable change in electric field).

It should thus be recognized that the disclosed sensor 100 which measures a plurality of signals (e.g., current and voltage, rather than current alone) may advantageously minimize false positive and false positive signals.

A further advantageous feature of the disclosed sensor 100 is dynamic determination of the threshold(s) of the monitored signal(s) as continuously calculated by the processor 160. In that regard, the sensor 100 includes a high voltage pulse generator 110A, with the holiday detector unit 150 over time detecting a plurality of at least one electric signal associated with the pulsing current. The processor 160 continuously processes the plurality of each signal type (e.g., current or voltage) detected for a recent selected time period (e.g., 30 pulses per second for one second) and continuously generates and updates a dynamic baseline or threshold for each signal type being detected. Such baseline(s) may be determined using the signals from the recent selected time period by a suitable method, such as energy averaging, filtering, and Fourier spectrum.

Figure 9:
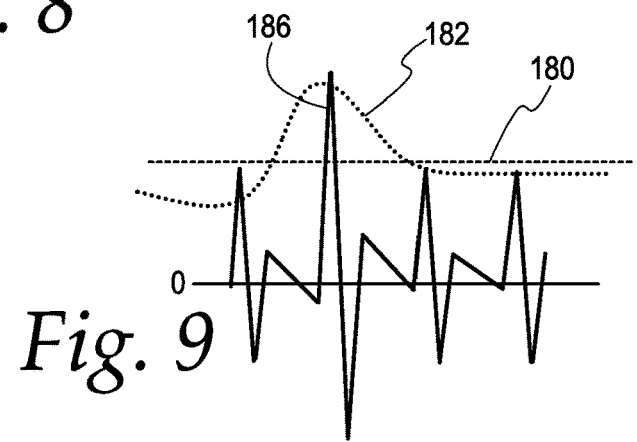
FIG. 9 illustrates a sample waveform of detected current showing the threshold used with the prior art sensors versus the threshold as determined by the new sensors disclosed herein.

FIG. 9 illustrates this function in comparison to the prior art sensors in which the thresholds were manually adjustable but otherwise fixed. In the illustrated example, it can be seen that while the fixed threshold of the prior art is a flat line 180, the dynamic, self-adjusting threshold 182 will change given environmental changes encountered by the movable contact 120 (e.g., different soil resistivity in the area of the movable contact 120 and/or motion of the movable contact 120). Thus, in the prior art, a peak 186 which exceeds the flat line threshold 180 of the prior art would be taken to (falsely) indicate a holiday in the location of the movable contact 120, even though the peak 186 may result from environmental factors in the area of the movable contact 120 and not a holiday. By contrast, with the sensor 100 disclosed here, the processor 160 will dynamically include such factors to create a self-correcting dynamic threshold 182 so that the comparison of the signal to the threshold will factor in environmental factors to avoid false positive signals. Similarly, where the environmental factors will cause a reduction in the signal, the processor 160 as disclosed herein will result in a reduced threshold (or a dip in the threshold) and avoid false negative signals.

Figure 10:
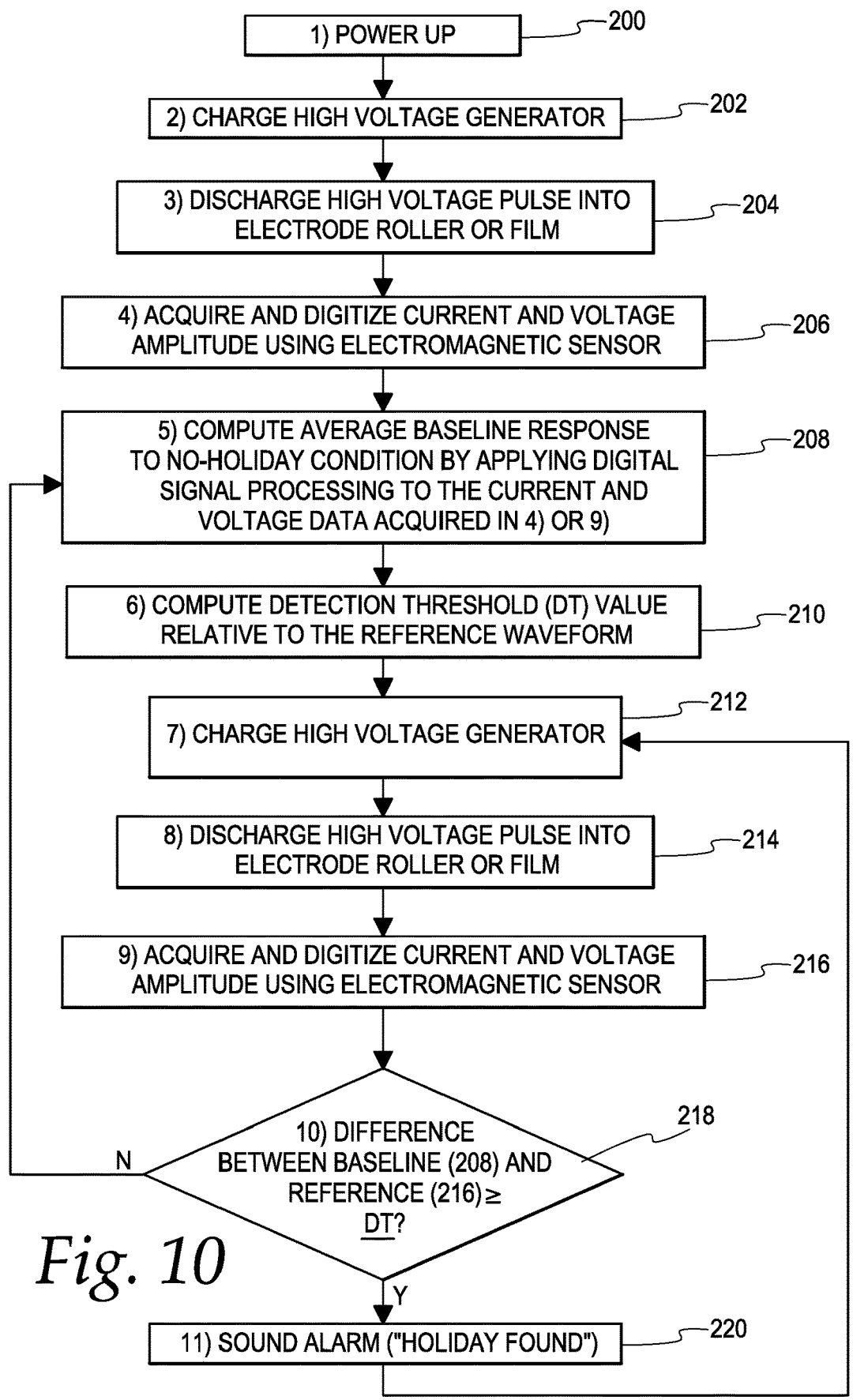
FIG. 10 is a flow chart showing the operation of a new sensor such as disclosed herein which measures both current and voltage amplitudes and uses such measured amplitudes to dynamically determine thresholds for each indicative of the presence of a holiday.

FIG. 10 is a flow chart showing the method of operation of the sensor 100 disclosed herein with both dynamic threshold determination and detection of multiple different signals.

Specifically, the sensor 100 is first turned on (step 200) and the high voltage pulse generator 110A charged (step 202). A high voltage pulse is discharged through the high voltage cable 116 to the movable contact 120 (step 204), and the electromagnetic detector 150A of the holiday detector unit 150 acquires the current and voltage amplitude (step 206) of that pulse, which the processor 160 uses to compute average signal strength indicative of a holiday (step 208). At step 210, the processor 160 uses the computed signal strength from step 208 to compute a detection threshold relative to the electric reference (e.g., ground 14) of the generator 110. The high voltage pulse generator 110A is again charged (step 212) and a pulse discharged to the movable contact 120 (step 214), with the electromagnetic detector 150A of the holiday detector unit 150 acquiring the current and voltage amplitude (step 216) of that pulse. This process of repetitively discharging a high voltage pulse which the electromagnetic detector 150A detects and the processor 160 uses to update the dynamic threshold is repeated over and over until a determined amount of pulse data has been acquired, at which point when another pulse is added to the data, data for the oldest pulse is excluded from the average computed in step 208. Operation then continues in that manner until the processor 160 determines that a pulse has exceeded the current computed detection threshold (e.g., current and/or voltage amplitude), in which case an alarm or location indicator 144 is sent.

The sensor 100 may advantageously allow the operator to control the high voltage pulsing such as described above by depressing a suitable trigger switch when such pulsing is desired (at step 200 initially, and later at step 212 when enough data has been acquired).

The location indicator 144 may be a conventional audible alarm included with the holiday detector unit 150 which sounds when a holiday is detected (the sound thereby alerting the operator that a holiday is present at the location of the movable contact 120), and/or may also include any suitable signal, including visual signals (e.g., a light) or a digital signal marking the location of the movable contact 120 (and thus the holiday) on the grid.

With an understanding of the above disclosure, it should be recognized that detection of holidays in liners (e.g., geomembranes) may be advantageously, easily and reliably accomplished, with minimal false positive and/or false negative indications.

The invention claimed is:

1. A method of detecting holidays in a liner having uneven contours, comprising the steps of:
creating a circuit for current from a generator to a first contact with said liner to a second contact spaced from said first contact to said generator, said second contact being an electric reference for said generator;
pulsing current from said generator to said liner first contact as said first contact is moved over and maintains uniform contact with said liner, wherein said liner is a geomembrane on a geotechnical site, and said first contact is a flexible moveable contact that conforms to the uneven contours of said liner, wherein the first contact includes a truck rolling on guide wheels and a plurality of conductive rollers spaced along a flexible conductive cable supported between said guide wheels;
detecting a plurality of at least one electric signal associated with said pulsing current from said electric reference;
continuously processing a selected recent plurality of said detected electric signals to generate a baseline value for said at least one electrical signal, wherein a detected electric signal having a value on one side of the baseline is deemed to indicate no holiday and an electric signal having a value on the other side of the baseline is deemed to indicate a holiday; and
actuating a holiday signal when at least one of said detected electric signals has a value on said other side of said baseline.

2. The method of claim 1, wherein said second contact is with the top of said liner.

3. The method of claim 1, wherein said second contact is with ground beneath said liner.

4. The method of claim 1, wherein:
said liner has a top surface and a bottom surface;
said liner bottom surface is electrically conductive; and
said first and second contacts are in contact with said liner top surface.

5. The method of claim 1, wherein said geomembrane comprises a plurality of liners joined together at seams.

6. The method of claim 1, wherein said at least one electric signal is a selected one of current strength and voltage.

7. The method of claim 1, wherein said at least one electric signal comprises both current strength and voltage, wherein said detected current strength is continuously processed to generate a baseline of current strength and said detected voltage is continuously processed to generate a baseline of voltage.

8. The method of claim 7, wherein said holiday signal is generated when either of said current strength or voltage passes its generated baseline.

9. The method of claim 1, wherein at least one of energy averaging, filtering, and Fourier spectrum is used to generate the baseline from the recent plurality of detected electric signals.

10. The method of claim 1, wherein said baseline is a selected average of the recent plurality of detected electric signals.

11. The method of claim 1, wherein said actuated holiday signal is at least one of an audible sound and a warning light.

12. The method of claim 1, wherein said actuated holiday signal is a location indication corresponding to the area of the liner being contacted by the first contact at the time the detected electric signal has a value on the other side of the baseline.

13. The method of claim 12, wherein said actuated holiday signal is at least one of a signal of grid coordinates on the liner, an audio signal, a visual signal, and a signal of GPS coordinates.

14. A sensor for detecting holidays in a liner having uneven contours, comprising:
   a pulsing generator with an electric reference;
   an electrode adapted to move over and maintain uniform contact with the liner, said electrode being spaced from said generator electric reference while said generator pulses current to said electrode, wherein said liner is a geomembrane on a geotechnical site and said electrode includes a flexible moveable contact that conforms to the uneven contours of said liner, wherein said contact includes a truck rolling on guide wheels and a plurality of conductive rollers spaced along a flexible conductive cable supported between said quide wheels;
   a processor adapted to
      detect over time from said generator electric reference at least one electric signal associated with said pulsing current,
      continuously process for a recent selected time period the at least one electric signals detected during said selected time period, and
      generate a baseline of said at least one electrical signal, wherein a detected electric signal having a value on one side of the baseline is deemed to indicate no holiday and an electric signal having a value on the other side of the baseline is deemed to indicate a holiday; and
      a holiday signal actuated when any detected electric signal has a value on said other side of said baseline.

15. The sensor of claim 14, wherein said electric reference is positionable on said liner.

16. The sensor of claim 14, wherein said processor is adapted to detect a selected one of current strength and voltage.

17. The sensor of claim 14, wherein said processor is adapted to:
   detect both current strength and voltage;
   continuously process current strength to generate a baseline of current strength; and
   continuously process voltage to generate a baseline of voltage.

18. The sensor of claim 17, wherein said holiday signal is actuated when either of said detected current strength or detected voltage is on the other side of its generated baseline.

19. The sensor of claim 14, wherein said processor is adapted to use at least one of energy averaging, filtering, and Fourier spectrum to generate the baseline from the recent plurality of detected electric signals.

20. The sensor of claim 14, wherein said actuated holiday signal is at least one of an audible sound and a warning light.

21. The sensor of claim 14, wherein said holiday signal is a location indication corresponding to the area of the liner being contacted by the electrode at the time the detected electric signal value is on said other side of said baseline.

* * * * *